United States Patent
Tsironis

(10) Patent No.: US 10,591,530 B1
(45) Date of Patent: Mar. 17, 2020

(54) COPLANAR LOAD PULL TEST FIXTURE FOR WAVE MEASUREMENTS

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/004,579

(22) Filed: Jun. 11, 2018

(51) Int. Cl.
| | |
|---|---|
| *G01R 31/02* | (2006.01) |
| *G01R 31/26* | (2014.01) |
| *G01R 1/067* | (2006.01) |
| *G01R 31/28* | (2006.01) |
| *H01L 21/66* | (2006.01) |

(52) U.S. Cl.
CPC ..... *G01R 31/2601* (2013.01); *G01R 1/06772* (2013.01); *G01R 31/26* (2013.01); *G01R 31/2621* (2013.01); *G01R 31/2642* (2013.01); *G01R 31/2853* (2013.01); *H01L 22/34* (2013.01); *H01L 2924/00* (2013.01); *H01L 2924/0002* (2013.01); *H01L 2924/00014* (2013.01)

(58) Field of Classification Search
CPC ......... H01L 2924/0002; H01L 2924/00; H01L 2924/00014; H01L 22/34; G01R 31/2601; G01R 31/26; G01R 31/2642; G01R 31/262; G01R 31/2853
USPC ......... 324/71, 378, 403, 415, 425, 500, 537, 324/762.01
See application file for complete search history.

(56) References Cited

U.S. PATENT DOCUMENTS

| | | | |
|---|---|---|---|
| 6,414,563 B1 | 7/2002 | Tsironis | |
| 7,282,926 B1 | 10/2007 | Verspecht et al. | |
| 10,001,521 B1* | 6/2018 | Tsironis | G01R 1/045 |
| 2015/0073749 A1* | 3/2015 | Simpson | G01R 27/28 |
| | | | 702/182 |
| 2019/0017931 A1* | 1/2019 | Sertel | G01R 31/303 |

OTHER PUBLICATIONS

"Test Fixture for Medium and High Power RF Transistors," Product Note 7, Focus Microwaves, Jan. 1994.
"Time Domain," [online], Wikipedia, [Retrieved on Jun. 6, 2018], Retrieved from Internet URL <https://en.wikipedia.org/wiki/Time_domain>.
"Coplanar Waveguide." [online], Wikipedia, [Retrieved on Jun. 6, 2018], Retrieved from Internet URL <https://en.wikipedia.org/wiki/Coplanar_waveguide>.
Fourier inversion theorem, [online], Wikipedia, Retrieved on Jun. 6, 2018], Retrieved from Internet URL <https://en.wikipedia.org/wiki/Fourier_inversion_theorem>.
"Differential amplifier," [online], Wikipedia, [Retrieved on Jun. 6, 2018] Retrieved from Internet URL <https://en.wikipedia.org/wiki/Differential_amplifier>.
"Coaxial 50W 2-18 GHz 16dB Directional Coupler", datasheet [online], RF-Lambda, [Retrieved on Jun. 6, 2018] Retrieved from Internet URL< http://www.rflambda.com/pdf/directionalcoupler/RFDC2G18G16.pdf>.

* cited by examiner

*Primary Examiner* — Raul J Rios Russo

(57) ABSTRACT

Coplanar waveguide microwave transistor test fixtures include integrated wideband signal sensors/couplers and allow the detection of the main signal and its harmonic components, generated by a transistor in high power operation mode, by using a phase-calibrated network or signal analyzer and thus the reproduction of real time signal waveforms.

6 Claims, 11 Drawing Sheets

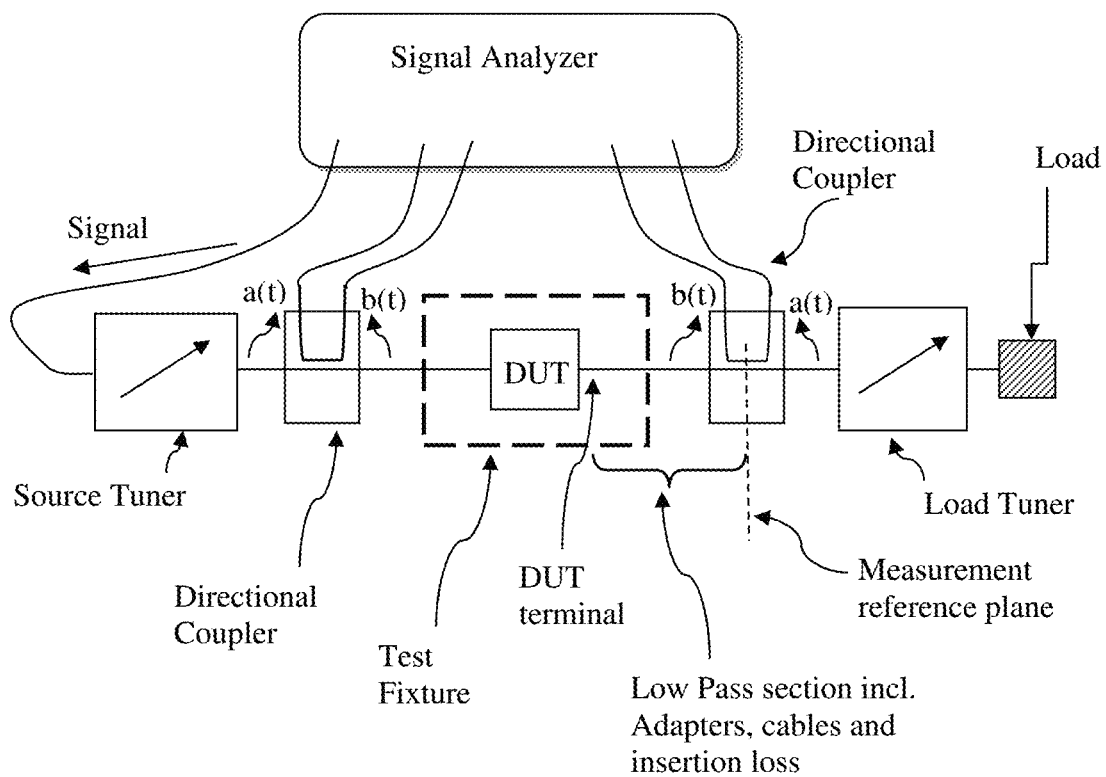
FIG. 1: prior art

FIG. 2A: prior art
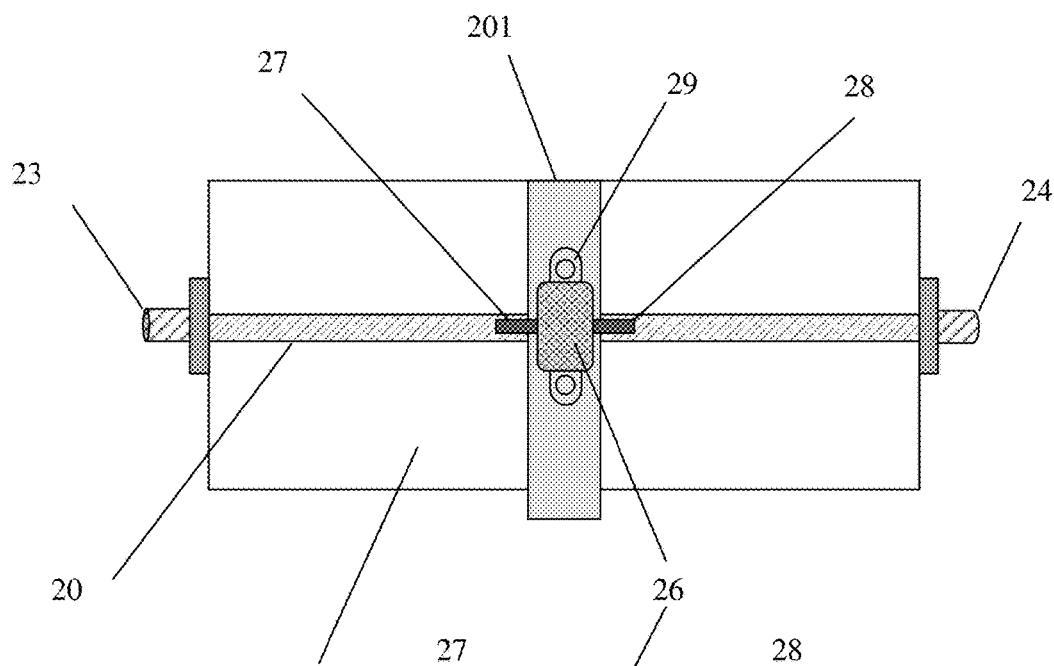
FIG. 2B: prior art
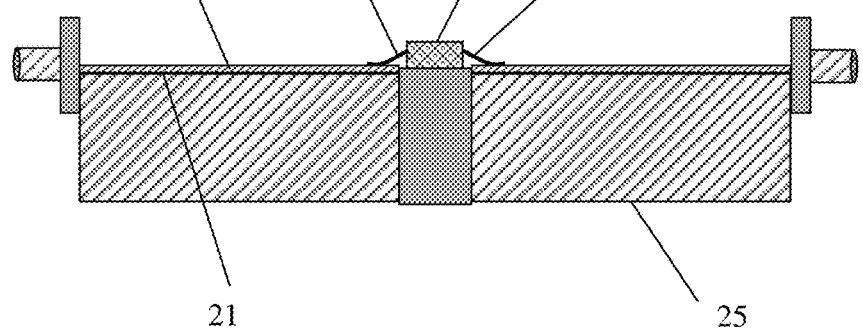

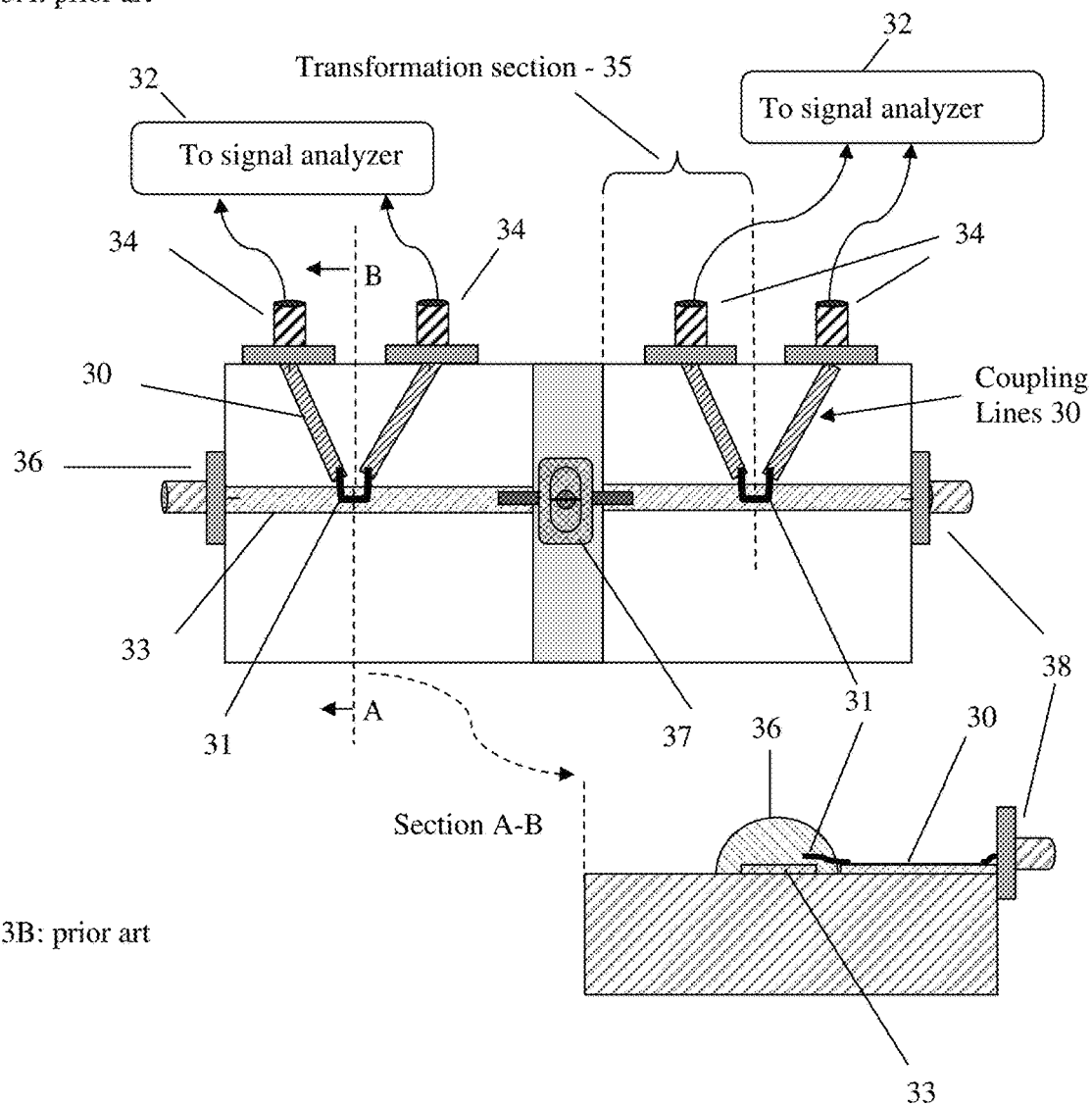
FIG. 3A: prior art
FIG. 3B: prior art

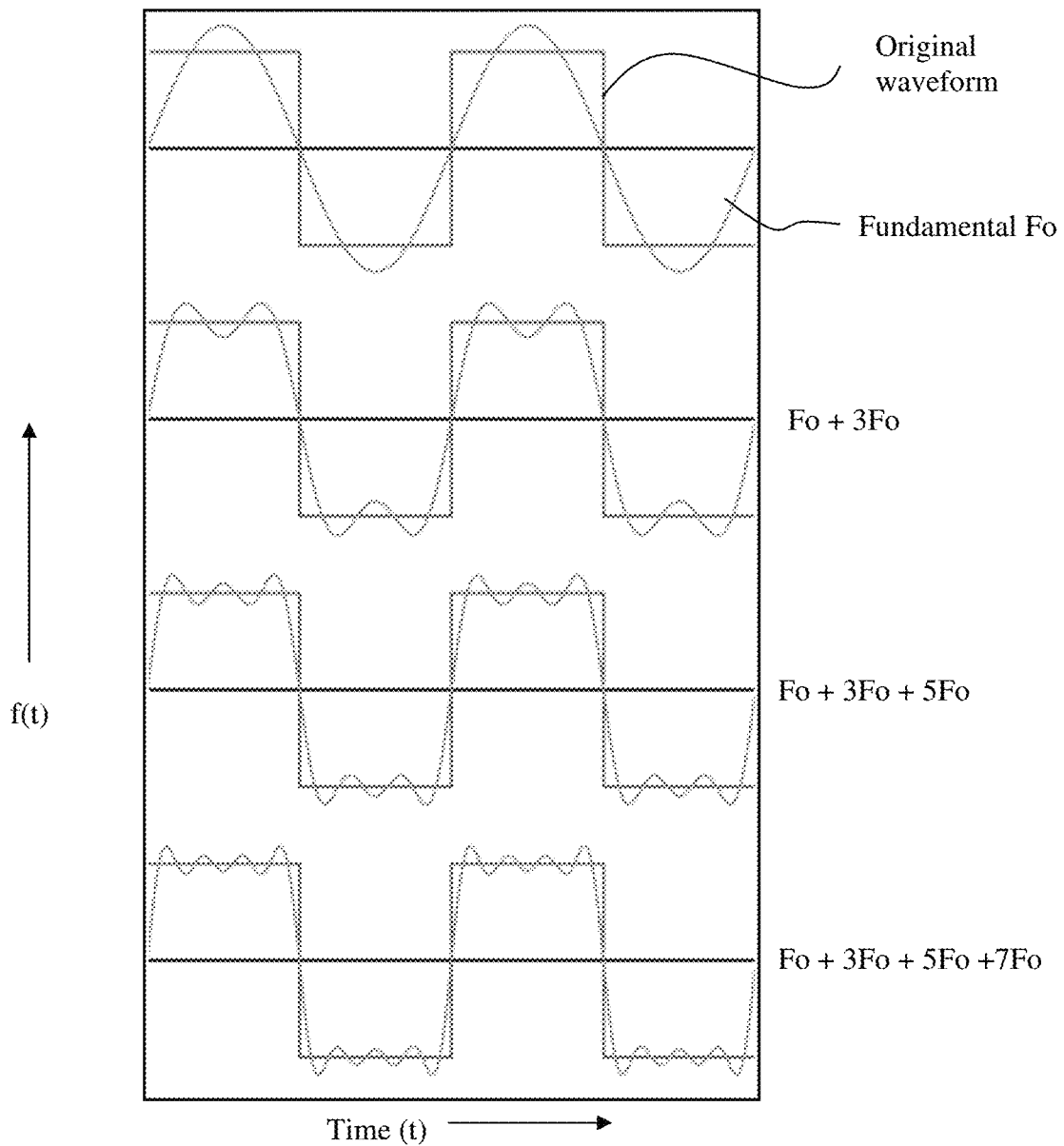
FIG. 4: prior art

Frequency 1-20GHz

SXY = Transmission from port Y to port X

FIG. 6A
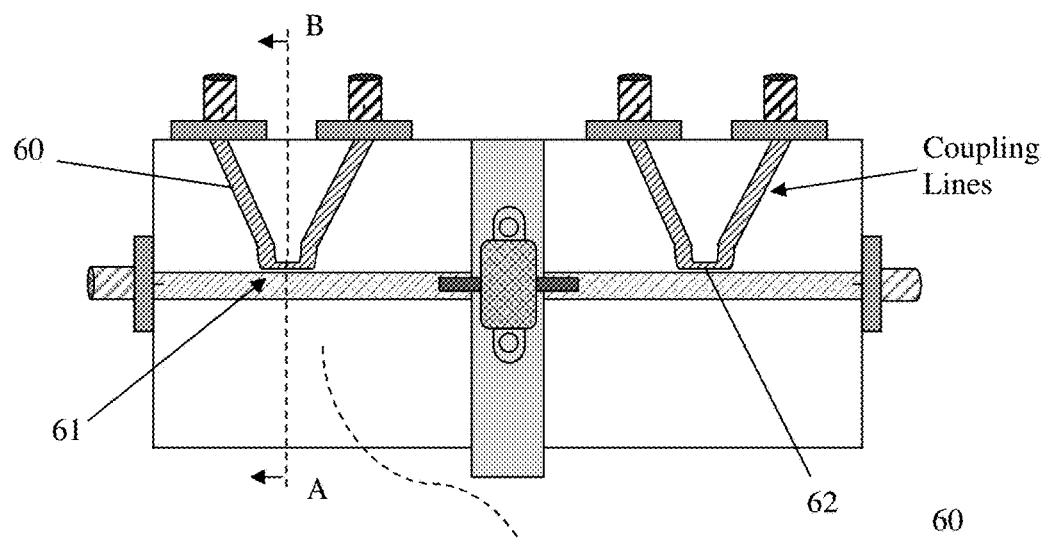
Coupling Lines
Section A-B
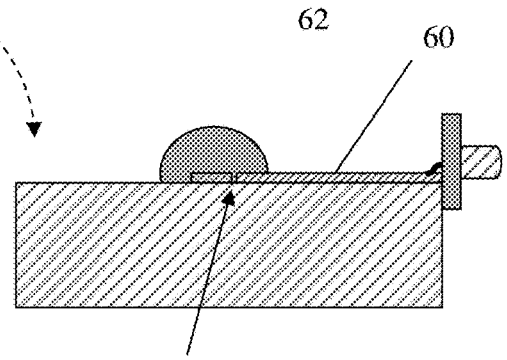
61
Narrow gap for electro-magnetic coupling
FIG. 6B

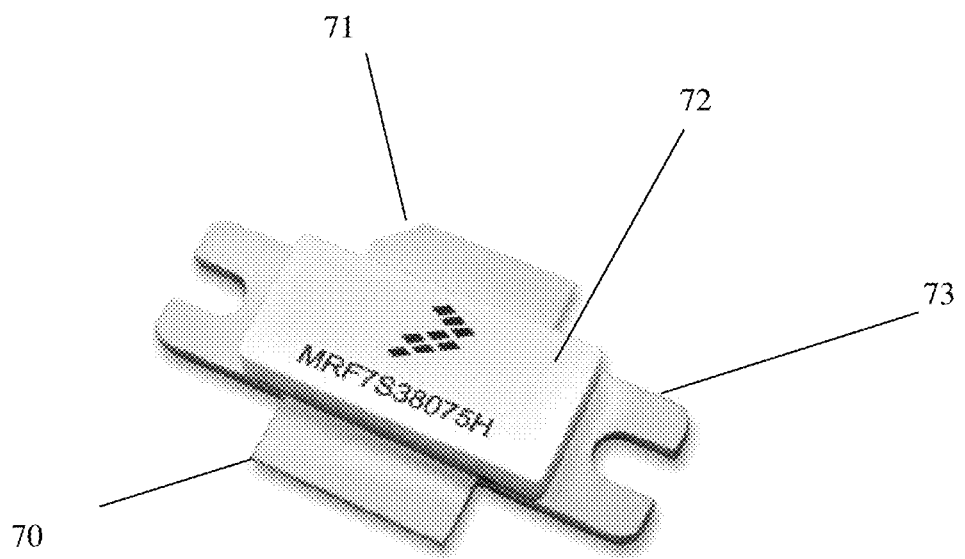
FIG. 7: prior art

FIG. 9A : prior art
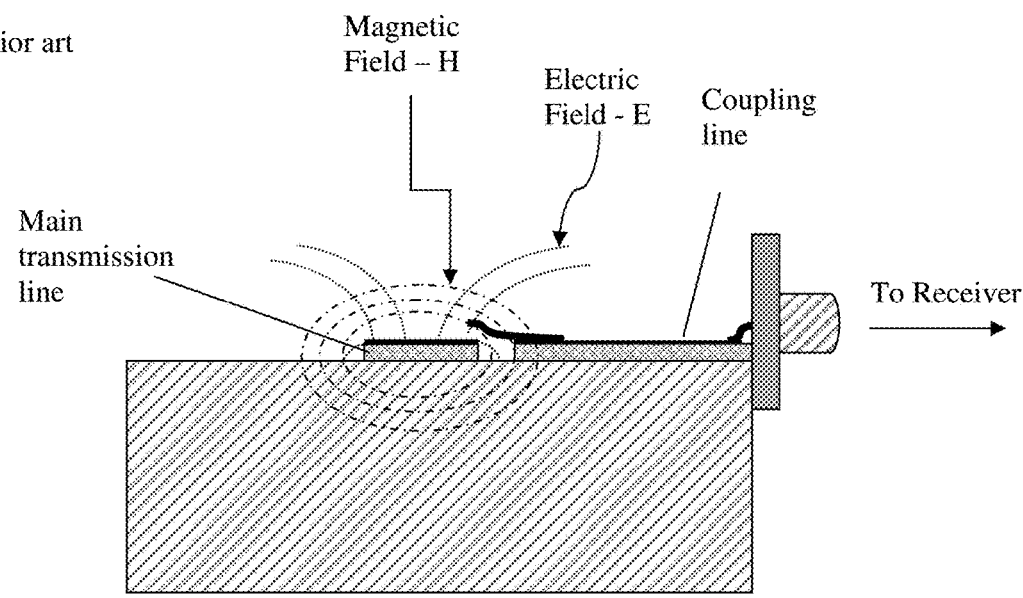
FIG. 9B: prior art
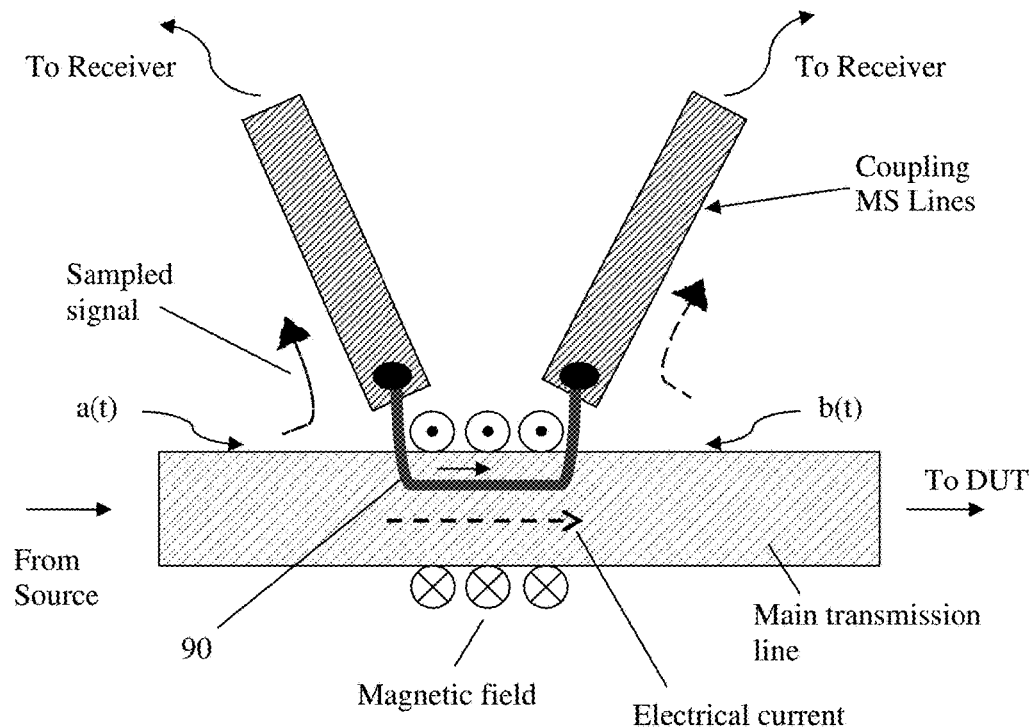

FIG 11A: prior art
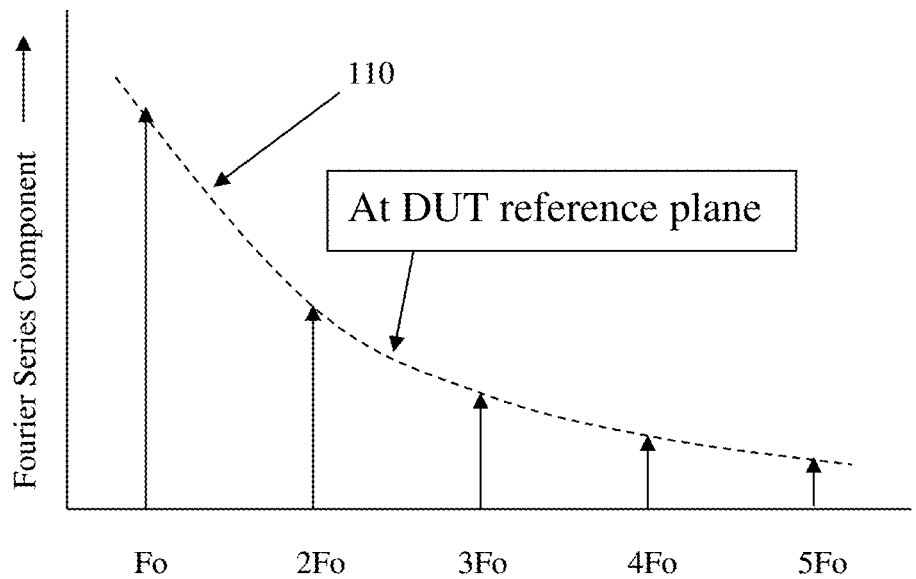
FIG. 11B: prior art
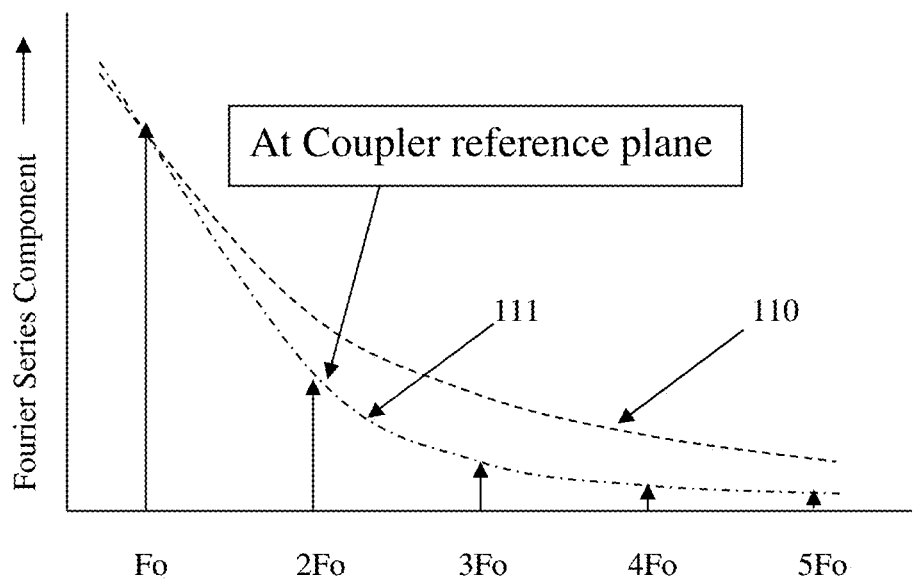

US 10,591,530 B1

COPLANAR LOAD PULL TEST FIXTURE FOR WAVE MEASUREMENTS

PRIORITY CLAIM

Non applicable.

CROSS-REFERENCE TO RELATED ARTICLES

1. Tsironis, C., U.S. Pat. No. 6,414,563, "Low-loss microwave device test fixture with adjustable blocks."
2. "Test Fixture for Medium and High Power RF Transistors," Product Note 7, Focus Microwaves, January 1994.
3. "Time Domain," [online], Wikipedia, [Retrieved on 2018 Jun. 6], Retrieved from Internet URL<https://en.wikipedia.org/wiki/Time_domain>.
4. "Coplanar Waveguide." [online], Wikipedia, [Retrieved on 2018 Jun. 6], Retrieved from Internet URL<https://en.wikipedia.org/wiki/Coplanar_waveguide>.
5. "Fourier inversion theorem", [online], Wikipedia, Retrieved on 2018 Jun. 6, Retrieved from Internet URL<https://en.wikipedia.org/wiki/Fourier_inversion_theorem>.
6. Verspecht et al. U.S. Pat. No. 7,282,926, "Method and an apparatus for characterizing a high-frequency device-under-test in a large signal impedance tuning environment."
7. "Differential amplifier," [online], Wikipedia, [Retrieved on 2018 Jun. 6] Retrieved from Internet URL<https://en.wikipedia.org/wiki/Differential_amplifier>.
8. "Coaxial 50 W 2-18 GHz 16 dB Directional Coupler", datasheet [online], RF-Lambda, [Retrieved on 2018 Jun. 6] Retrieved from Internet URL<http://www.rflambda.com/pdf/directionalcoupler/RFDC2G18G16.pdf>.
9. Tsironis, C., U.S. Pat. No. 10,001,521, "Transistor Test Fixture with Integrated Couplers and Method."

BACKGROUND OF THE INVENTION

This invention relates to test fixtures used in load pull testing of RF transistors in microwave frequencies (see ref. 1 and 2

Active RF components (transistors—DUT) need to be thoroughly tested at the operation frequencies before used in amplifier and other circuit designs. "Load pull" and "Source pull" are test methods which use impedance tuners to systematically characterize the DUTs under various load and source impedance conditions. Load pull or source pull are automated measurement techniques used to measure Gain, Power, Efficiency and other characteristics of the DUT, employing source and load impedance tuners and other test equipment, such as signal sources, directional couplers, test fixtures to house the DUT (device under test, typically an RF transistor) directional couplers and signal analyzers (FIG. 1, see ref. 3).

At high power the semiconductor DUT's become "non-linear", i.e. input and output signals are related, but not any more directly proportional. A single frequency (Fo) sinusoidal signal at the input of the DUT is distorted at the output, meaning that, when exiting the DUT, it contains "harmonic components" (FIG. 11). Periodical signals, sinusoidal or not, can be described as a Fourier series of the fundamental (Fo) and harmonic (N*Fo) frequency components (see ref. 5). The wave-form of the exiting signal depends on the operation conditions of the transistor, especially the impedance of the load.008 The trajectory of the voltage across the IV (current-voltage) characteristic of the transistor is called the "load-line" and depends strongly on the load impedance, which is controlled by the impedance tuners. The load-line determines the efficiency, linearity and reliability of the transistor and amplifier operation. This is the main reason why the signal waveforms must be detected and optimized. In order to be able to observe the actual signal waveform at the DUT terminals in the time domain, whereas the measurement occurs at a different position in the network, we must transform the signals from the measurement reference plane to the DUT reference plane. For this we must work in the "frequency domain"; i.e. we must convert the time function f(t) into a Fourier series of harmonic signals, using the fundamental and harmonic components generated by the Fourier transformation (eq. 1) and apply the reference plane transformation frequency by frequency first. An inverse Fourier transformation allows then transferring the signal representation back from the frequency domain to the time domain:

$$f(t) = \frac{a_0}{2} + \sum_{k=1}^{\infty}\left(a_k\cos\frac{k\pi t}{\lambda} + b_k\sin\frac{k\pi t}{\lambda}\right) \qquad (eq.\ 1)$$

Hereby f(t) is the original time function (in the case of a transistor DUT, these are the voltages V1(t), V2(t) and currents I1(t) and I2(t) at the input and output terminals (ports) of the transistor correspondingly, a(t) and b(t) are the injected and extracted (reflected) signal waves and $a_k$ and $b_k$ their amplitudes at the harmonic frequencies k*Fo and $\lambda$ is the wavelength at the given fundamental frequency ($\lambda$(mm)≈300/F(GHz)), wherein F is the frequency. To be able to measure the real shape of the non-sinusoidal signals V(t) and I(t), which we define as "wave measurement" we must measure in the frequency domain the amplitude and phase of the fundamental and harmonic frequency components and convert back to the time domain. To do so we must detect those frequency components using signal samplers also called directional couplers (FIG. 1) and measure the frequency components using appropriate signal analyzers.

It is obvious (FIG. 11) that the higher the number of harmonics considered, the more accurate the description of the time behavior of the original signal becomes. This means, however, that as the harmonic components traverse the network and, because all networks have "low pass" behavior 110 to 111 shapes in FIG. 11, higher harmonic components will be suppressed more than lower ones (the signal is "smoothed"). In other words, the form of a non-sinusoidal signal changes as it travels along the "low pass" transmission line. By transforming back ("embedding") the signal harmonic components, measured by the signal analyzer, with the transfer matrix between the measurement point and the DUT, will reconstitute the original signal form. However parasitic components and strong low pass behavior of the network reduce the higher harmonic components over-proportionally (FIG. 11); then reconstitution of the original signal form is affected negatively. True reconstitution requires very high accuracy both of the measurement at the deferred position and the transfer matrix of the transformation section (35) in FIG. 3, respectively (71, 72) in FIG. 7, between the measurement position and the DUT terminals. This is the typical problem in analog telephony and associated distortion of the higher tones (harmonics) in voice or music transmission. Therefore, the closer the actual measurement reference plane to the DUT is, the easier and more accurate will be the reconstitution of the original signal waveform.

At high frequencies most electronic equipment, such as signal and network analyzers, operate in the frequency domain. In the frequency domain it is also easy to shift the reference plane of the measurement (em- and de-embedding). In order to sample the signal's components over a wide frequency range (the more harmonic components are known, the more accurate is the correspondence between the time and frequency domain of a signal, see FIG. 4) we need wideband signal directional couplers. Those couplers can be connected on both sides of the test fixture in which the DUT is mounted (FIG. 1). However such a setup includes connectors, adapters and transmission lines between the DUT and the couplers and suffers from higher insertion loss and low pass behaviour and creates considerable signal deformation due to parasitic components of the connectors and the other fixture parts. This causes the necessary reference plane corrections to become larger and thus possibly inaccurate.

BRIEF DESCRIPTION OF THE DRAWINGS

The invention and its mode of operation will be better understood from the following detailed description when read with the appended drawings in which:

FIG. 1 depicts prior art: a load pull test system with signal waveform detection.

FIG. 2A through 2B depict prior art: top and side views of a micro-strip transistor test fixture; FIG. 2A depicts a top view; FIG. 2B depicts a side view.

FIG. 3A through 3B depict prior art: a micro-strip transistor test fixture with integrated signal detection couplers attached to microstrip lines; FIG. 3A depicts a top view of the entire fixture; FIG. 3B depicts a cross section of a microstrip line and signal coupler made using a wire bridge.

FIG. 4 depicts prior art: the approximation of a rectangle time domain waveform f(t) with Fourier components of increasing order.

FIG. 5A depicts coupling (S31, S42) and isolation (S32, S41); FIG. 5B depicts a top view of the fixture and definitions of coupling coefficients.

FIG. 6A through 6B depict a micro-strip transistor test fixture with integrated signal detection couplers made entirely using microstrip sections instead of wire bridges; FIG. 6A depicts a top view of the entire fixture; FIG. 6B depicts a cross section of a microstrip line and signal coupler a coaxial cable line and signal coupler made entirely using etched microstrip.

FIG. 7 depicts prior art: a single-ended (one input and one output terminal) packaged RF power transistor.

FIG. 9A through 9B depict prior art: the electric and magnetic field lines in a microstrip signal coupler; FIG. 9A depicts a cross section; FIG. 9B depicts a top view.

FIG. 11A through 11B depict prior art: FIG. 11A depicts the harmonic components of an input signal at Fo when exiting the DUT at the DUT terminals; FIG. 11B depicts the harmonic components of the signal after traversing a low pass transmission section comprising microstrip line and adapters. Harmonic component suppression increases with frequency.

DETAILED DESCRIPTION OF THE INVENTION

Figure 5A:
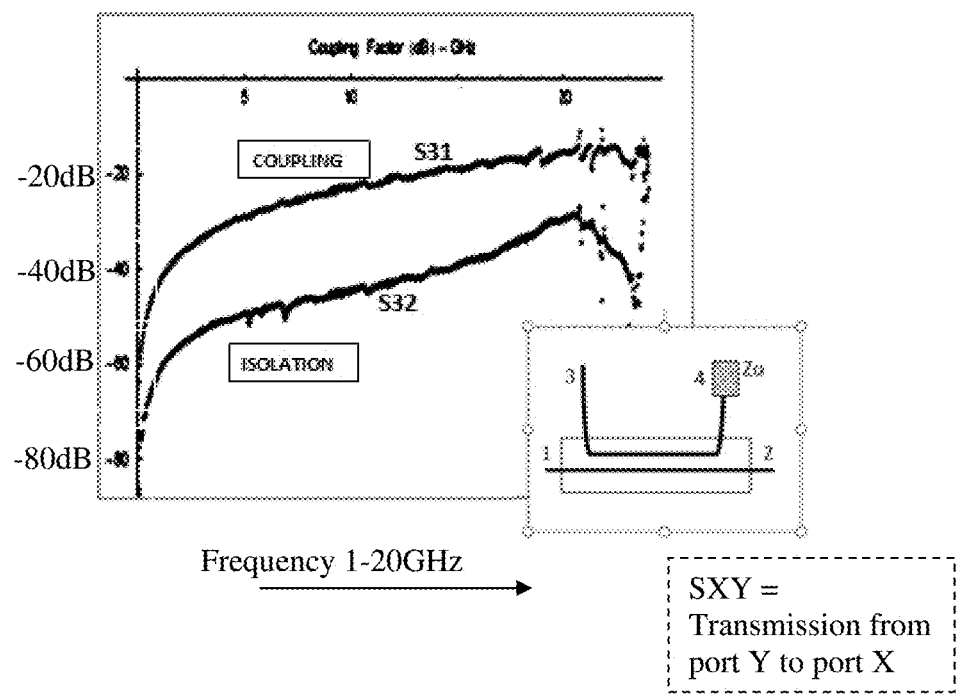
FIG. 5A through 5B depict typical measured frequency dependent data of a signal coupler in a CPW fixture.

Regular transistor test fixtures come in two basic forms: Micro-strip (MS) fixtures, FIG. 2 (see ref. 2) or Coplanar Waveguide (CPW) fixtures, FIG. 8 (see ref. 4). MS fixtures (see ref. 9) come in form of simple micro-strip, wherein there are one or more metallized strips 20 on the top surface and a continuous metallized ground plane 21 on the bottom side of the dielectric substrate 22. In the case of coplanar waveguide (CPW), FIG. 8, the ground plane 80 is on the same top surface as the signal conductor 81 (see ref. 4). Both those types of test fixtures can be enhanced by adding signal couplers 30, 82 inside the enclosure of the test fixture and close to the DUT (FIGS. 3 and 8); the directional signal sampling (FIG. 9) is created through capacitive (electric) or inductive (magnetic) coupling of a set of conductive wire bridges 86 or conductor sections 100 to the main signal transmission line 82, 101.

A typical micro-strip (MS) transistor test fixture (FIG. 2) comprises at least two coaxial signal test ports, at least one input port 23 and at least one output port 24. A dielectric substrate 22 is soldered or mechanically mounted tightly on a metallic block 25 which serves as electrical ground and heat sink for the thermal energy dissipated by the DUT (transistor) 26. The signal travels on the micro-strip conductor(s) 20 from the input port(s) (connector) to the input terminal(s) (lead) of the transistor 27 and from the output terminal(s) (lead) 28 to the output port(s) (connector). There exist transistors with more than one input and output terminals, such as differential transistors (see ref. 7). The transistor package shown in FIG. 7 is a typical example of single-ended (one input 71 and one output 70 terminals) high power RF transistor. A heat resistant dielectric ceramic package 72 houses and protects the transistor semiconductor chip inside. The ground terminal of the DUT (typically the transistor source) is connected to a metallic support 73, which is mounted tightly 29 with screws or clamps on the test fixture insert 201. The insert can be replaced by another one of different form or size holding a different transistor package or with calibration standards for calibrating the fixture (see ref. 2).

Figure 8:
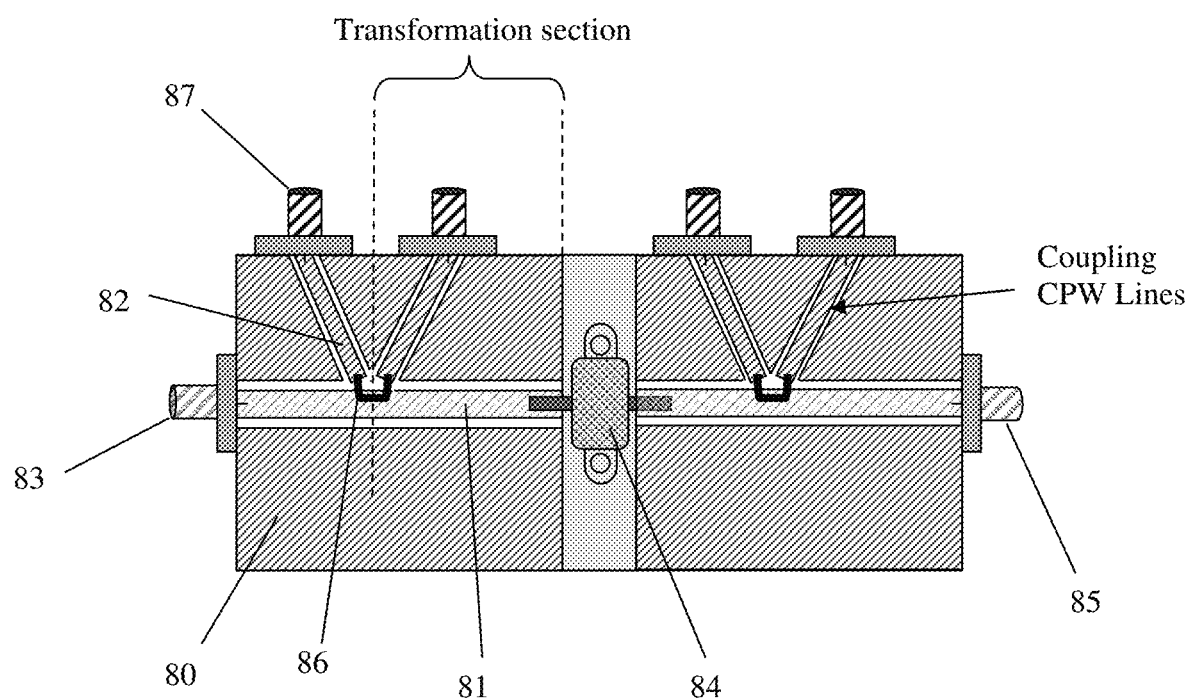
FIG. 8 depicts a coplanar waveguide (CPW) fixture with signal couplers made using wire bridges.
Figure 10:
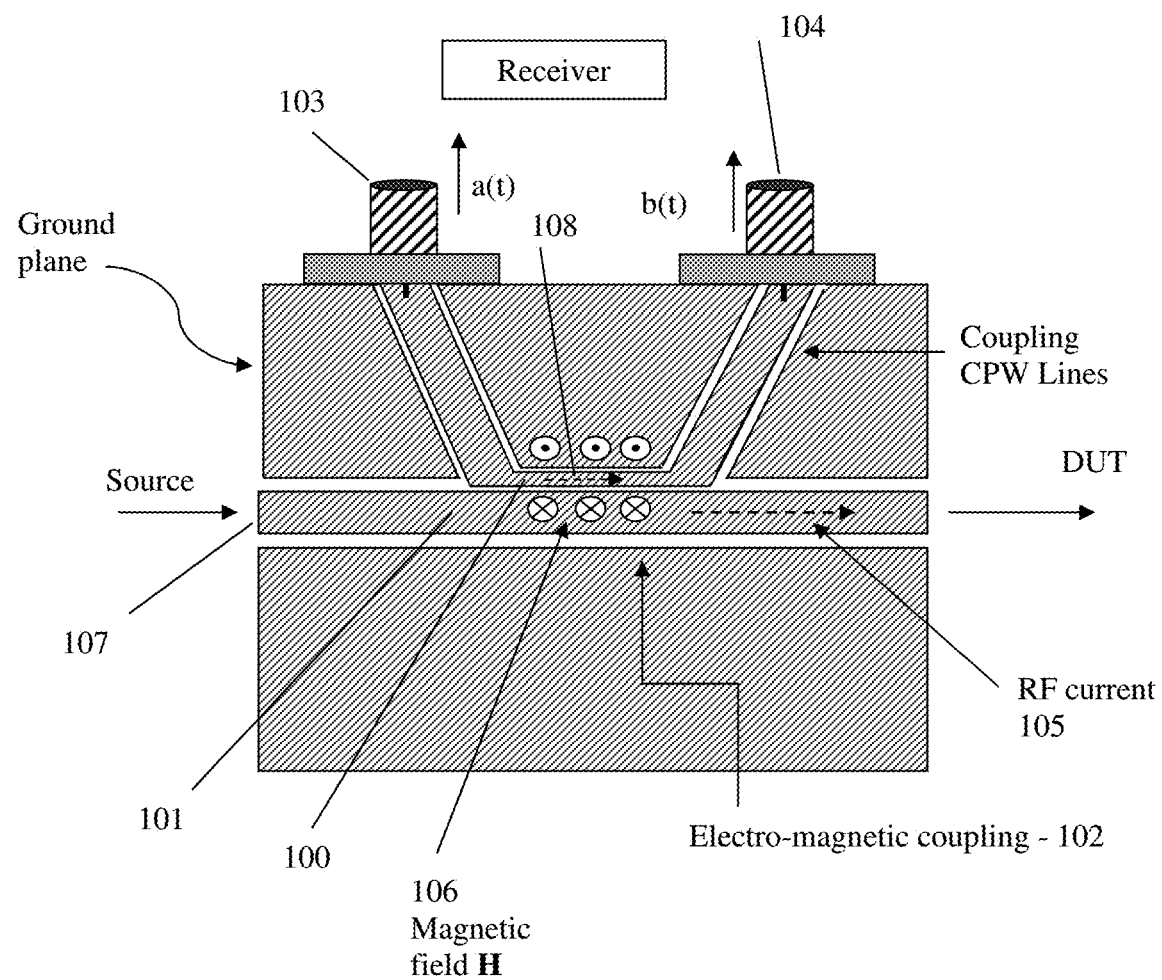
FIG. 10 depicts the equivalent of FIG. 9 in coplanar waveguide (CPW): a detail top view of the wideband electro-magnetic signal coupler.

The coplanar waveguide CPW (see ref. 4) fixture is shown in FIG. 8. In this case the signal is conducted from the input port 83 to the DUT 84 and from the DUT to the output port 85 on a metalized strip line 81, which is separated by a narrow gap from the surrounding metalized ground plane 80, which is deposited on the same (top) surface of the dielectric substrate. The coupling lines 82 are constructed the same way and lead to the same type of electro-magnetically (non-contacting) coupled wire bridges 86. The coupling lines 82 lead to coaxial connectors 87, which are connected with the signal analyzer using RF cables. In FIG. 10 the input portion of a coplanar test fixture and the signal coupler are shown. Herein the bridge 90 (FIG. 9) is made using a section of coplanar line 100, electro-magnetically (non-contacting) coupled 102 with the main transmission line 101. The section 100 leading to the coaxial connectors and from there to the signal analyzer (receiver). The signal forward wave a(t) is detected at the forward coupled port 103 and the reverse signal wave b(t) at the reverse port 104.

In a transmission line (FIG. 9B) the signal transmitted can always be described as the sum of two travelling power waves: a(t) in forward direction and b(t) in reverse direction. Between a(t) and b(t) and the voltage v(t) and current i(t) on the transmission line there are simple relations, whereby Zo is the characteristic impedance of the transmission line (typically 50 Ohms):

$$a(t) = \frac{v(t) + Zo*i(t)}{2*\sqrt{Zo}} \text{ and } b(t) = \frac{v(t) - Zo*i(t)}{2*\sqrt{Zo}} \quad \text{(eq. 2)}$$

There are a number of configurations allowing a small part of the signal traversing the test fixture to be coupled out and measured by the signal analyzer (FIG. 1). As can be seen in FIG. 3A, and the section A-B (FIG. 3B), micro-strip lines 30 approximately perpendicular to the main transmission line 33 connect the coupling connectors 34 with the main transmission line on a contactless manner using a wire bridges 31. This can be seen from the top (FIG. 3A) or from the side in a cross section drawn at the center of a bridge (FIG. 3B). Such electro-magnetic (non-contacting) coupling extracts a small part of the signal power into the lines 30 leading to the signal analyzer 32. The wire bridges are, in general, flexible. By adjusting their proximity to the transmission line one can manually adjust the coupling factor S31 (FIG. 5). The equivalent coupling mechanism using coplanar waveguide (CPW) instead of microstrip is demonstrated graphically in FIG. 10: The electrical current 105 flowing inside the conductive micro-strip 101 creates a surrounding magnetic field H 106 which induces a current 108 inside the coupled conductive section 100. The incident power wave a(t) is predominantly sampled by the forward port 103 of the coupler, whereas the reflected power wave b(t) in predominantly sampled by the reverse port 104 of the coupler. The ratio between the main signal power a(t) and the signal power at the input port 107 is called "coupling factor S31" and the ratio between the signal power at the input port 107, and the port 104, when the coupler is loaded at the DUT port with the characteristic impedance Zo (here 50 Ohms), is called "reverse coupling factor S32". The ratio between the signal powers at ports 103 and 104 is called "coupler directivity", FIG. 5. The quantities in FIG. 5 are logarithmic in dB (X(dB)=10*log(X)).

FIG. 5 shows measured data of a typical signal coupler, made on a micro-strip test fixture, loaded with a 50 Ohm resistance, using a coupled wire loop 50 over a frequency range of 1 to 10 GHz. The structure is the same as in FIG. 3. The signal enters in port [1] and exits port [2]. Part of the signal is coupled forward to port [3] and another part is "leaked" into port [4]. No power is coming back from port [2] since it is loaded with the characteristic impedance of 50 Ohms of the micro-strip line. The coupling factor S31 is shown to vary from −40 dB to −25 dB and the associated reverse coupling factor S41 from below −50 dB to −30 dB. The associated "directivity" varies therefore from >30 dB to 10 dB correspondingly.

The signal couplers can be incorporated in either test fixture structure as shown in FIGS. 3, 5, 6 and 8. In the test fixtures of FIGS. 3, 6 and 8 the signal couplers are using wave coupling (see ref. 6) through wire bridges, whereas in the case of test fixtures of FIGS. 6 and 10 the coupling uses coplanar transmission lines. In either case the detected waves a(t), b(t) and associated voltage v(t) and current i(t) can be converted into each-other using equation 2. The short coupled sections of CPW 62, 100 have characteristic impedance as well. It can be the same as the other transmission lines (Zo=50 Ohm) or, in order to increase the current density and thus the coupling magnetic field, it is preferable to design them narrower for a higher characteristic impedance Zc>Zo and create an effect similar to the wire bridge.

A prior art microstrip-based test fixture with signal couplers is shown in FIGS. 3A and 3B. The signal entering port 36 travels on the micro-strip 33 to the transistor 37 and exits port 38. At the plane A-B a part of the signal energy is electro-magnetically coupled into the loop 31 which is coupled with the line 33 in a non-contacting relation and is fed into a signal analyzer through access ports 34. The data shown in FIG. 5 have been taken with a fixture like the one in FIG. 3. This configuration also shows the advantage of the structure: the transformation section 35 between the signal detection reference plane and the transistor output ports is kept to a minimum and eliminates most parasitic components associated with transmission lines, adapters connectors etc. thus allowing detection of the higher harmonic components more accurately and therefore a better reconstruction of the original time waveform using the inverse Fourier transformation (see ref. 5 and FIG. 4).

A similar structure to FIG. 3 is shown in FIG. 6. The micro-strip leads 60 are the same as 30 in FIG. 3, but the coupling section 61 is not made using a wire conductor 31 as in FIG. 3, but as the continuation of the micro-strip 60. This structure (see also FIG. 10) functions similar to the coaxial coupling in the micro-strip structure of FIG. 3. The coplanar waveguide (CPW) layout allows also an effective construction of the signal couplers as shown in FIG. 10; the electric signal from the source is coupled to the signal analyzer (receiver 103) through the narrow gap between the main line 101 and the coupled section 100. This technique allows well controlled and reproducible, but not adjustable, coupling manufactured using photolithographic techniques on standard CPW substrates.

Figure 5B:
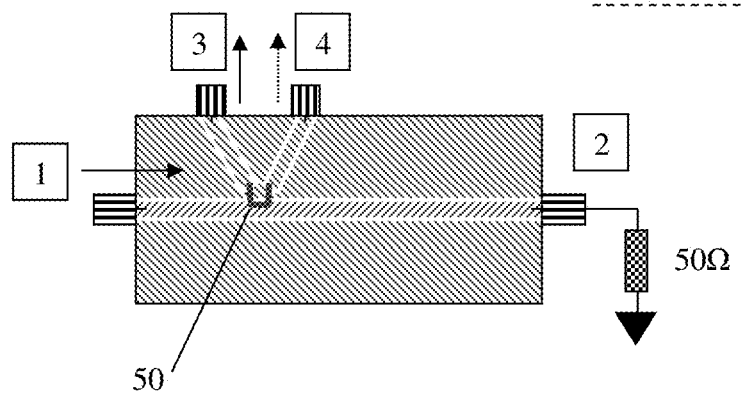

In all cases outlined before the actual coupling factor is increasing with frequency (FIG. 5A). This is an inherent advantage of this kind of signal coupler compared with "flat response" couplers (see ref. 8). Increasing coupling with frequency allows sampling a higher portion of the harmonic signal components compared with the fundamental frequency and thus further compensating low pass characteristics of the fixture transmission line, which suppresses high frequency harmonic components, thus enhancing the overall sensitivity of the measurement.

Although the present invention has been explained hereinabove by way of a preferred embodiment thereof, it should be pointed out that other combinations of the described components are possible and, as far as obvious to a person skilled in the art, they shall not limit the scope of the present invention.

What I claim as my invention is:

1. A coplanar waveguide (CPW) test fixture for RF (radio frequency) transistors (device under test, DUT) comprises at least one input test port and at least one output test port, at least one main transmission line connecting the input test port with an input terminal of the DUT, and at least one main transmission line connecting an output terminal of the DUT with the output test port, and at least one directional signal coupler, wherein the at least one directional signal coupler is integrated in the test fixture and placed close to the DUT, between a test port and the associated DUT terminal, and is electro-magnetically coupled to the main transmission line, in a non-contacting relationship, and wherein the at least one directional signal coupler samples a portion of a transmitted signal and can be operationally connected with a signal analyzer to measure the portion of the transmitted signal.

2. The directional coupler(s) of claim 1 comprising two coplanar waveguide (CPW) coupling lines and one coupled CPW section, wherein the CPW section is placed parallel, in proximity and coupled electro-magnetically with a main CPW transmission line, and wherein each end of the coupled CPW section is connected to one end of an associated coupling CPW line, and wherein the other end of the coupling CPW line is connected to a coaxial connector attached to the test fixture.

3. The test fixture of claim 2 comprising two signal couplers, one between the input test port and the DUT input terminal and one between the DUT output terminal and the output test port.

4. The test fixture of claim 1 comprising two coplanar waveguide (CPW) coupling lines and one conductive wire bridge, wherein the wire bridge is placed in proximity and coupled electro-magnetically with a main CPW transmission line in a non-contacting relationship, and wherein each end of the wire bridge is connected to one end of an associated coupling CPW line, and wherein the other end of the coupling (CPW) line is connected to a coaxial connector attached to the test fixture.

5. The test fixture of claim 2, wherein the transmission and coupling lines have characteristic impedance Zo=50 Ohms.

6. The test fixture of claim 2, wherein the transmission lines have characteristic impedance Zo=50 Ohms and wherein the coupling lines have characteristic impedance Zc>Zo.

* * * * *